United States Patent [19]

Matzen et al.

[11] 3,982,266
[45] Sept. 21, 1976

[54] INTEGRATED INJECTION LOGIC HAVING HIGH INVERSE CURRENT GAIN

[75] Inventors: Walter T. Matzen; Wilton L. Workman, both of Richardson, Tex.

[73] Assignee: Texas Instruments Incorporated, Dallas, Tex.

[22] Filed: Dec. 9, 1974

[21] Appl. No.: 530,774

[52] U.S. Cl.................................... 357/44; 357/46; 357/50
[51] Int. Cl.² ........................................ H01L 27/04
[58] Field of Search.......................... 357/44, 46, 50; 307/213, 215, 299 B, 303

[56] References Cited
UNITED STATES PATENTS

| | | | |
|---|---|---|---|
| 3,436,279 | 4/1969 | Klein | 357/50 |
| 3,534,234 | 10/1970 | Clevenger | 357/50 |
| 3,598,664 | 8/1971 | Kilby | 357/50 |
| 3,648,125 | 3/1972 | Peltzer | 357/50 |
| 3,736,477 | 5/1973 | Berger et al. | 357/44 |
| 3,818,289 | 6/1974 | Mudge | 357/50 |
| 3,823,353 | 7/1974 | Berger et al. | 357/44 |
| 3,873,989 | 3/1975 | Schinella et al. | 357/50 |

OTHER PUBLICATIONS
Berger, "The Injection Model...(MTL)," IEEE Journal of Solid State Circuits, vol. SC9, Oct. 1974, pp. 218–224.

Wiedmann, "Injection–Coupled Memory," IEEE Journal of Solid State Circuits, vol. SC8, Oct. 1973, p. 337.

Evans et al., "Oxide–Isolated Monolithic...," IEEE Journal of Solid State Circuits, vol. SC8, Oct. 1973, pp. 374–378.

*Primary Examiner*—William D. Larkins
*Attorney, Agent, or Firm*—Harold Levine; James T. Comfort; Gary C. Honeycutt

[57] ABSTRACT

An integrated injection logic (IIL) structure including active devices, one of which is a switching transistor having base current injection from another active device where an epitaxial zone forms an emitter-base junction. A diffused zone in the epitaxial layer forms a collector for the switching transistor and an insulating structure defines perimeters of the collector-base junction and the emitter-base junction such that the widths thereof are about equal for maximizing current gain with minimal temperature dependence.

6 Claims, 6 Drawing Figures

INTEGRATED INJECTION LOGIC HAVING HIGH INVERSE CURRENT GAIN

This invention relates to integrated injection logic (IIL) wherein a given element is common to two active devices, one of which is a transistor where, in an epitaxial structure, the width of an emitter-base junction and the width of a collector-base junction approach equality with high collector doping across the entire collector-base junction.

Semiconductor structures have heretofore been provided wherein a PNP device serves as a source of injection current for the base of an NPN device. Such structures have been identified as merged transistor logic (MTL) or integrated injection logic (IIL) because of commonality of structure and function as between two active devices.

Basic IIL structure resembles D.C.-transistor logic or resistor-transistor logic but fundamentally differs in the current supply mode. More particularly, IIL uses multi collector transistors which have a common emitter and common PNP current source which drives base regions of a number of multi collector transistors. In IIL logic, all NPN transistor emitters are tied to a common reference potential, normally ground, and thus can be implemented in a common N plane to achieve high density. In terms of standard bipolar structure, this means that a common-collector N-P-N transistor is employed and operated upside down so that what generally is considered to be the collector region becomes the emitter. Such inverted type of operation is involved in IIL and in such setting is considered to be a normal mode of operation.

Inverse current gain and the temperature dependence thereof severely limit operation of IIL devices. It would be desirable that the structure so be constructed that the inverse current gain is maximized.

Devices operated in the inverse mode are especially useful in circuits operated in common emitter circuits because multiple collectors from a given switching transistor can be employed for the control of a plurality of additional switching transistors where all of the devices have a common emitter terminal which can be the bottom layer in or on a semiconductor chip. Thus, there is a family of significant devices in which the maximization of the current is desired and where the devices should have minimal dependence upon temperature variations.

The present invention is directed to an IIL structure in which the total collector-base junction area approaches as close as possible the area of the emitter-base junction and in which the collector doping near the collector-base junction is maintained as high as possible across the entire junction.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

Figure 1:
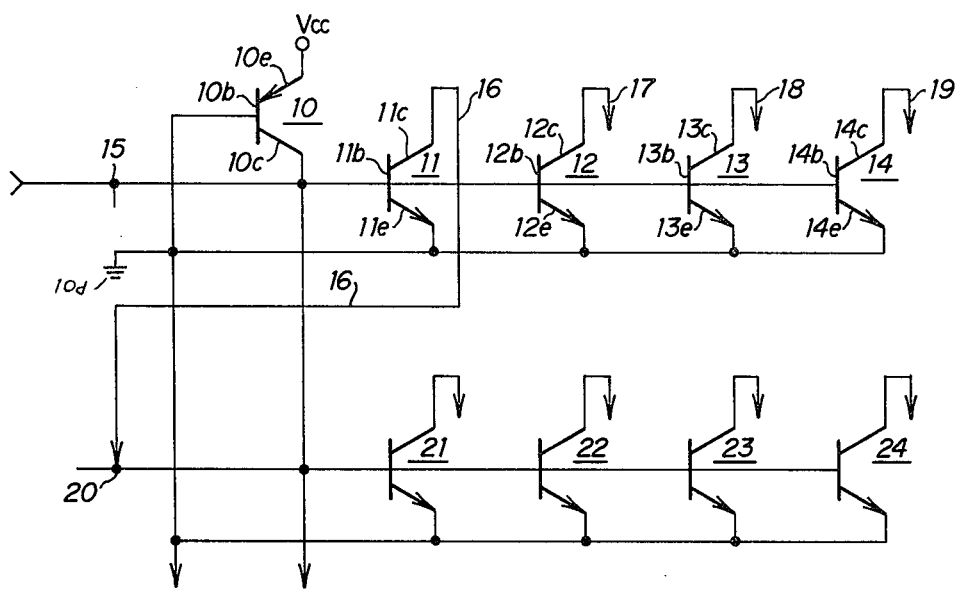
FIG. 1 is a circuit diagram illustrating common emitter logic.

Referring now to FIG. 1, an IIL circuit is illustrated in which common emitter logic is employed. A PNP transistor 10 is connected at its emitter 10e to a current source $V_{CC}$, and at its base 10b to a common ground, 10d. The collector 10c of transistor 10 is connected to the bases 11b, 12b, 13b and 14b of NPN transistors 11–14. An input terminal 15 is the logic input point for the circuit. An array 31 of NPN transistors 11–14 is provided with emitters 11e–14e thereof connected to ground 10d. Collectors 11c–14c of transistors 11–14 are utilized to acquire logic output signals.

Collector 11c is connected by way of conductor 16 to a base terminal 20 on a second merged transistor logic array 33 which includes NPN transistors 21–24. Collector 12c is to be connected by way of channel 17 to a base terminal (not shown) on a third IIL array. Similarly, collectors 13c and 14c are to be connected to a fourth array and a fifth array, respectively.

In operation of the circuit of FIG. 11, if the input state on terminal 15 is false or zero, then the bases 11b–14b are shorted to ground so that there is no current flow and the collectors 11c–14c are maintained at a true or a one state. If a true state is applied to terminal 15, this causes current to flow and the collectors 11c–14c are false or in a zero state.

The application of the zero state to terminal 20 from collector 11c causes the collectors of transistors 21–24 to be in a true or one state. The collectors of transistors 12–14 and 21–24 may thus be connected to further circuits in the manner shown in FIG. 1.

It is in the setting of a circuit such as that of arrays 31 and 33 that a present invention is utilized. It relates to a structure in which a circuit such as shown in FIG. 1 can be provided wth maximum current gain and minimum temperature dependence for the common emitter NPN transistor array.

The gain, $h_{fe}$, of the common emitter structure and the temperature dependence thereof can be a severe limitation in IIL type logic. It would be desirable to provide a structure such that $h_{fe}$ of the common emitter structure is maximized. This will occur when:

1. The areas of the collectors are maximized; i.e., the ratio of the sum of the collector areas to the common emitter area approaches unity.

2. Emitter doping near the emitter base junction is as high as possible across the entire junction.

3. Minority carrier life time is as high as possible in the emitter.

In the present invention, the ratio by the areas of the collector and emitter is maximized by providing oxide isolation side walls for each side of each of the arrays 31–36. The concentration of N+ at the emitter base junction of an IIL unit is maintained by employing an N+ chip and then be employing a low temperature epitaxial process to form a surface epitaxial layer thereon. The use of the low temperature process results in the formation of a sharp emitter base junction. Long lifetime of minority carriers is obtained by slow cooling and minimizing metallic impurities such as gold.

Figure 2:
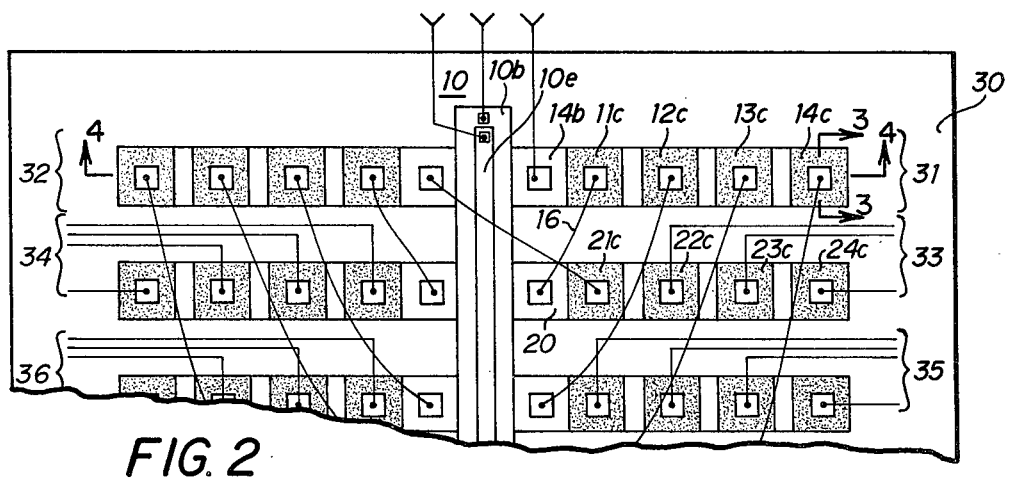
FIG. 2 is a plan view of an application of the invention in an integrated circuit logic embodying circuits as shown in FIG. 1.

FIG. 2 illustrates a semiconductor chip 30 in which is formed an integrated circuit as shown in FIG. 1. Transistor 10 is a wide transistor structure extending medially across chip 30. The base region 10b and the emitter region 10e of transistor 10 are at the surface and are thus accessible for the base and emitter connections as shown in FIG. 1. In this embodiment of the invention, the arrays 31, 33 and 35 extend laterally across the chip 30 from the right boundary of the transistor base 10b. Arrays 32, 34 and 36 extend from the left-hand side of transistor 10. Array 31 includes transistors 11-14 of FIG. 1 and array 33 includes transistors 21-24 of FIG. 1. Similarly, arrays 32, 34, 35 and 36 each includes four transistors each. It will be noted from FIG. 1 that the signal input terminal 15 and the current injection path including collector 10c of transistor 10 are connected directly to bases 11b-14b of all transistors 11-14. Thus, there is a common base zone at the surface which in FIG. 2 has been designated by the single base zone 14b. The collectors 11c-14c then appear at the surface of the transistor and are accessible by way of output terminals. There is one input terminal and four output terminals for each of the arrays.

It will be noted in FIG. 1 that conductor 16 interconnects collector 11c to the input terminal 20 on the array 33. Consistent therewith, in FIG. 2 the input terminal 15 is connected to the base terminal 14b. Collector 11c is connected by conductor 16 to the input terminal 20 of array 33. In a similar manner, the collector 12c is connected to the input terminal of array 35. Collectors 13c and 14c may be connected similarly to input terminals on additional arrays (not shown). Further, for the purpose of illustrating the manner in which the invention is employed, collector 21c is connected to the input terminal of array 32. The first collector of array 32 is connected to the input terminal of array 33. The second collector of array 32 is connected to the input terminal of array 36. Thus, extended fanout capability of logic is made available. It will be understood that while arrays 31-36 are shown comprising four transistors each, the number of transistors may be increased or decreased.

In accordance with the present invention, the boundaries of the arrays 31-36 are so constructed that the width of the emitter base junction is equal to the width of the base collector junctions. Thus, each of the arrays 31-36 is separately bounded by an isolation region which extends from the surface of chip 30 through the base emitter junction.

Figure 3:
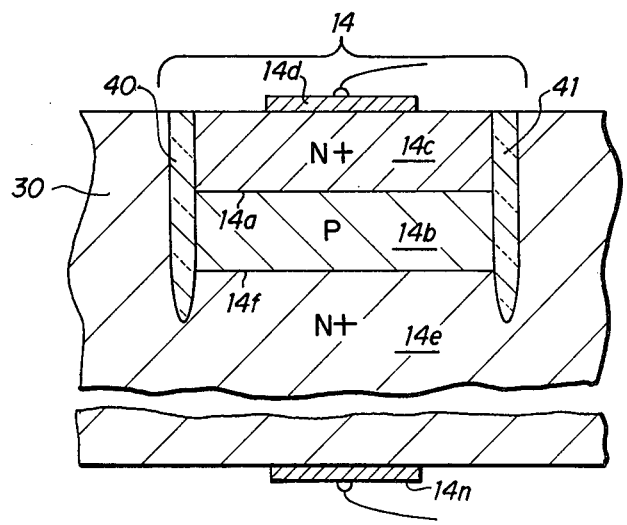
FIG. 3 is a schematic diagram illustrating a boundary structure employed in the present invention.

In FIG. 3, transistor 14 is illustrated in a section of the upper portion of a semiconductor chip 30. Transistor 14 has emitter base junction 14f and base collector junction 14a of equal widths. More particularly, emitter 14e contacts the base 14b at the junction 14f. The base 14b contacts collector 14c at the junction 14a. A pair of oxidized isolation sidewalls 40 and 41 serve as boundaries for the collector 14c and base 14b.

With the widths of the boundaries 14a and 14f about equal, collector doping near the base junction 14f is made as high as possible across the entire junction, preferably through the low temperature controlled epitaxial process, above noted.

Figure 4:
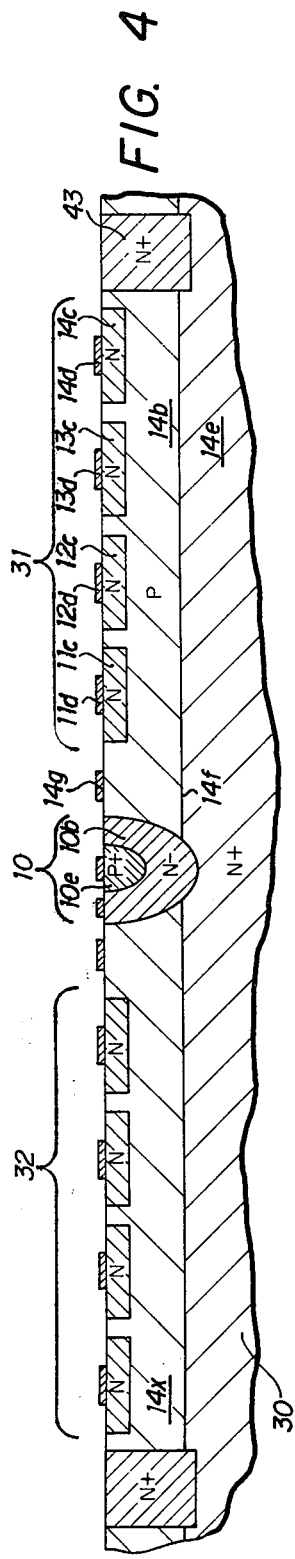
FIG. 4 is a diagrammatic sectional view of an IIL structure taken along lines 4—4 of FIG. 2.

FIG. 4 is a sectional view of arrays 31 and 32 of FIG. 2. Chip 20 is shown as having emitter 14e formed of an N+ doped substrate. An epitaxial layer for base 14b is formed on the surface of the substrate 30. Transistor 10 is then formed with a diffused base 10b extending to and slightly through the boundary 14f. The emitter 10e of transistor 10 is then diffused into base 10b. Base 14b of transistor 12 then serves as the collector of transistor 10.

Base 14b is common to transistors 11-14 while serving as a collector of transistor 10. The collectors of transistors 11-14, namely collectors 11c-14c, are diffused regions at the surface of the epitaxial layer forming base 14b. Base 14b is a P doped region. Base 10b is an n-doped region. The emitter 10e is a P+ doped region. The transistors of arrays 32-36 thus each have a common base formed by the same epitaxial layer as base 14b. Surface contacts 11d-14d are provided as output terminals from the collectors 11c-14c. A terminal 14g is provided on the common base 14b to serve as a signal input contact for transistors 11-14. Similar terminals are provided for inputting signals to arrays 33-36 and for extracting four output signals from each said array.

Figure 5:
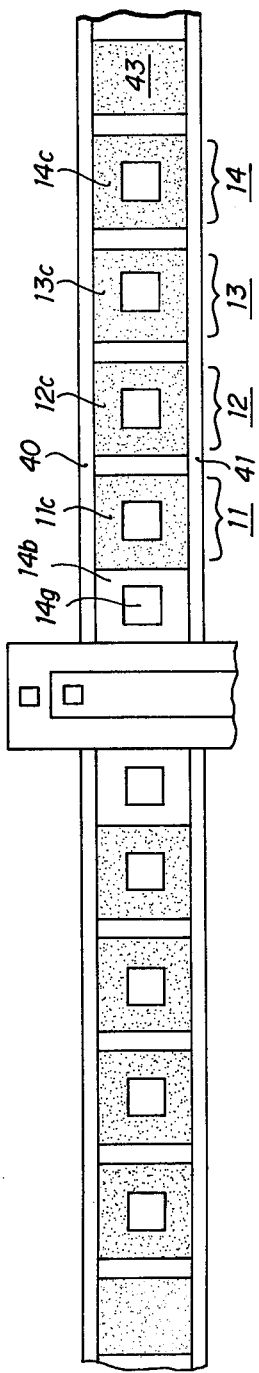
FIG. 5 is an enlarged view of the surface geometry of the elements of FIG. 4.

In FIG. 5, the arrays 31 and 33 have been shown in plan view. The transistors 11-14 are shown arrayed in tandem between the boundary walls 40 and 41, at successively increasing distances from the transistor 10. Transistor 10 provides current injection for all the transistors in the arrays 31-36 associated therewith.

In the same manner, an input contact and four collector output contacts are formed in the array 32 which extends from the left side of the transistor 10. The area between side walls 40 and 41 immediately beyond transistor 14 is preferably stopped by an N+ diffusion 43 which extends from the surface through the epitaxial layer to contact the N+ substrate. Such diffusions are formed at the end of each of the arrays 31-36 opposite the transistor 10.

Figure 6:
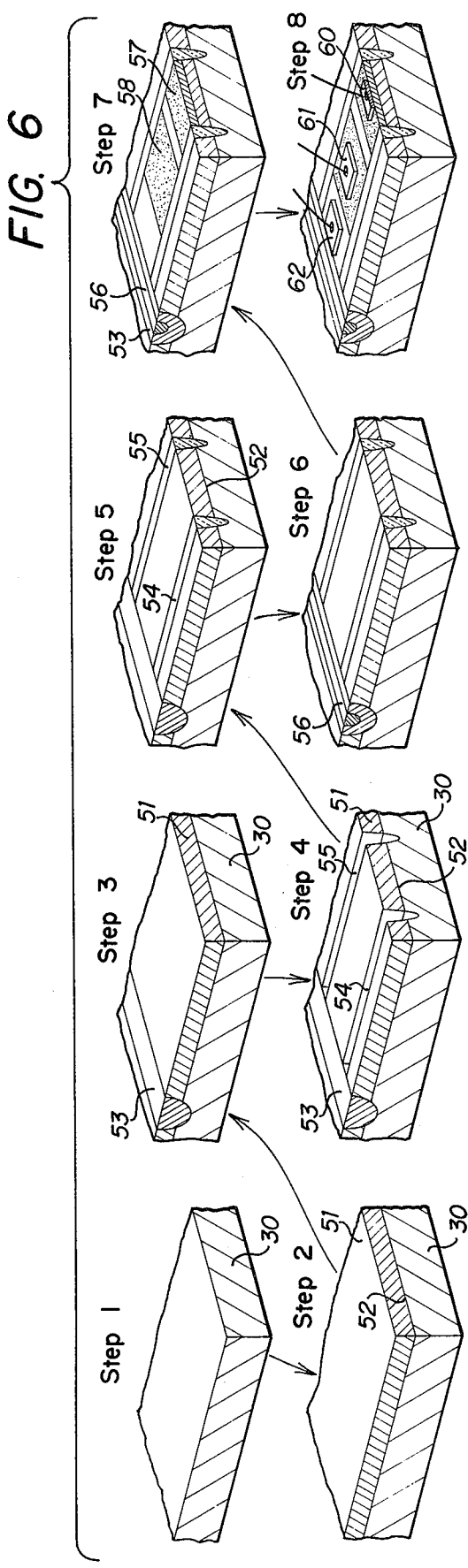
FIG. 6 illustrates a multi-step process for forming an integrated circuit embodying the invention.

FIG. 6 illustrates successive steps which are followed in fabricating the device of the type shown in FIG. 3, the parameters embodied therein being those set out in representative form in Table I.

| OPERATION | MASK | DIFFUSION | PROCESS VARIABLES | |
|---|---|---|---|---|
| | | | Thickness | Resistivity |
| 1 N+ Sub Prep | | | 20 mils | .008–.020 Ω-cm, Sb doped |
| 2 P Type Epi | | | 1–2 microns (5–10l) | ~5 Ω-cm |
| 3 N Diffusion-PNP Base | X | X | 5–10l | ~200 Ω/square |
| 4 Oxide Sidewall Isolation Process | X | | | |
| 5 P+ Injector | X | X | 3–8l | ~20 Ω/square |
| 6 N+ Collector | X | X | ½–1 microns (3–5l) | ~10 Ω/square |
| 7 Contacts | X | | | |

| OPERATION | MASK | DIFFUSION | PROCESS VARIABLES | |
|---|---|---|---|---|
| | | | Thickness | Resistivity |
| 8 Leads | X | | | |

In step 1, chip 30 in this example is provided as an N+ substrate of approximately 20 mils thickness and having resistivity of from 0.008 to 0.020 ohm centimeters, antimony doped. Alternatively, a P-Type substrate with an N+ diffused under film (DUF) layer may be used.

In step 2, substrate 30 is placed in an epitaxial reactor to grow a P epitaxial layer 51 of thickness of from 5 to 10 mercury lines, i.e., about 1 to 2 microns thick, and having a resistivity of around 5 ohm centimeters. Junction 52 is thus formed.

In step 3, an N-type diffusion is performed through a mask to form a base upon 53 for PNP transistor 10 and isolation junctions through boundary 52 between interim sidewalls 40 and 41 at the ends opposite the PNP base diffusion. Base diffusion 53 extends to the depth of at least the NPN base-emitter junction 52. The sheet resistance of the diffusion for the PNP base 53 is on the order of 200 to 800 ohms per square.

In step 4, grooves 54 and 55 are formed from the surface of the epitaxial layer 51 down to a depth below the junction 52. The grooves extend to the diffusion 53.

In step 5, the grooved semiconductor substrate 30 is placed in an oven and oxidized so that the grooves 54 and 55 become filled with oxidized insulation material, thus forming nonconducting sidewalls extending down below the junction 52.

In step 6, a P+ dopant is diffused through a mask to form the emitter zone 56 for PNP transistor 10. This zone preferably has a sheet resistance of about 10 ohms per square.

In step 7, N-type collector zones 57 and 58 are formed by diffusion through a mask to have a sheet resistance of about 10 ohms per square and a depth of the order of about ½ to 1 micron.

In the final step 8, the contacts 60, 61 and 62 are formed on zones 57, 58 and on the surface area between zone 58 and diffusion 53, respectively.

While FIG. 6 illustrates only a limited section, it is understood that the steps described may be applied generally to a large size integrated circuit to provide extensive fanout logic. In each case, however, one of two active devices is a switching transistor in a semiconductor substrate which is provided with base current injection. An epitaxial surface structure forms an emitter-base junction in a semiconductor substrate for the switching transistor. A diffused collector means in the epitaxial layer serves for switching the transistor. An insulating structure defines two of the perimeters of the collector-base junction and the emitter-base junction such that the junction widths are about equal. Preferably the insulating structure is a silicon oxide barrier extending from the surface of the epitaxial layer through the base-emitter junction. The insulating barrier serves at least in part to isolate a portion of the epitaxial layer such that the superposed junction widths are about equal. A plurality of such structures may be associated with a single current injection transistor.

Having described the invention in connection with certain specific embodiments thereof, it is to be understood that further modifications may now suggest themselves to those skilled in the art and it is intended to cover such modifications as fall within the scope of the appended claims.

What is claimed is:

1. A fanout logic system which comprises:
   a. a heavily doped first conductivity type semiconductor substrate having a second conductivity type epitaxial layer formed on one surface thereof,
   b. a wide bipolar transistor formed in said epitaxial layer with the epitaxial layer forming the collector of said transistor,
   c. a pair of isolation zones extending from the surface of said epitaxial layer through the lower boundary thereof and extending laterally from the base of said transistor to isolate a portion of said epitaxial layer,
   d. heavily doped first conductivity type regions between the ends of said isolation zones opposite said wide bipolar transistor, said regions extending through said epitaxial layer, and
   e. a plurality of diffused collectors in said epitaxial layer within said zones to form a multiple-collector bipolar transistor, complementary to said wide bipolar transistor with said epitaxial layer forming the common base region thereof, with the base-emmiter junction width equalling the base-collector junction width and wherein said epitaxial layer forming the collector of said wide bipolar transistor also forms the base of said multiple collector bipolar transistor.

2. The combination as set forth in claim 1 in which said first conductivity type is N type, and said second conductivity type is P-type, said substrate being an N+ substrate and said epitaxial layer being a P-type epitaxial layer.

3. The combination set forth in claim 1 in which said N+ substrate is formed as a diffused-under-film region in a P type semiconductor body and over which said P type epitaxial layer is formed.

4. An integrated circuit semiconductor logic fanout unit which comprises:
   a. an N+ semiconductor substrate having a P type epitaxial layer on one surface thereof,
   b. a wide PNP transistor formed in said layer with base and emitter terminals at the surface of said layer,
   c. a plurality of pairs of spaced apart insulating structures extending along parallel lines laterally across said structure from the base-collector boundary of said PNP transistor with said structure extending from the surface of said layer through the junction between said layer and the N+ substrate,
   d. N+ regions between the ends of said structures extending through said epitaxial layer to isolate collectors of each array, and
   e. an array of diffused collectors within each of said pair with said collectors of a given array spaced successively greater distances from said PNP transistor with said epitaxial layer forming a common base for said collectors while serving as the collector for said PNP transistor for current injection from said PNP transistor for all said collectors.

5. The combination set forth in claim 4 in which terminals are provided at the surface of said epitaxial layer
   i. for the emitter and base of said PNP transistor,
   ii. for said epitaxial layer outside the base of said PNP transistor to serve as a base terminal for NPN transistors and,
   iii. for each of said collectors.

6. The combination set forth in claim 5 in which at least one of said collectors between one pair of said structures is connected directly to the base terminal on said epitaxial layer between a different pair of said structures.

* * * * *